United States Patent
Nickel

(10) Patent No.: US 11,435,420 B2
(45) Date of Patent: Sep. 6, 2022

(54) METHOD AND APPARATUS FOR ACQUIRING MAGNETIC RESONANCE DATA DIXON METHOD WITH FLEXIBLE ECHO TIMES

(71) Applicant: Siemens Healthcare GmbH, Erlangen (DE)

(72) Inventor: Marcel Dominik Nickel, Herzogenaurach (DE)

(73) Assignee: Siemens Healthcare GmbH, Erlangen (DE)

(*) Notice: Subject to any disclaimer, the term of this patent is extended or adjusted under 35 U.S.C. 154(b) by 400 days.

(21) Appl. No.: 16/375,049

(22) Filed: Apr. 4, 2019

(65) Prior Publication Data
US 2019/0310335 A1 Oct. 10, 2019

(30) Foreign Application Priority Data
Apr. 4, 2018 (DE) .......................... 102018205067.8

(51) Int. Cl.
*G01R 33/48* (2006.01)
*G01R 33/56* (2006.01)

(52) U.S. Cl.
CPC ..... *G01R 33/4828* (2013.01); *G01R 33/5608* (2013.01)

(58) Field of Classification Search
CPC .................. G01R 33/4828; G01R 33/5608
See application file for complete search history.

(56) References Cited

U.S. PATENT DOCUMENTS

| | | | |
|---|---|---|---|
| 2012/0316795 A1* | 12/2012 | Eggers | G01N 24/08 702/22 |
| 2014/0043022 A1* | 2/2014 | Geerts-Ossevoort | G01R 33/5635 324/306 |
| 2015/0061667 A1 | 3/2015 | Nickel | |

(Continued)

FOREIGN PATENT DOCUMENTS

| | | |
|---|---|---|
| DE | 102013217650 A1 | 3/2015 |
| DE | 102014226052 A1 | 6/2016 |

OTHER PUBLICATIONS

Geppert, Christian et al.: "Three Images from Two Echoes: Reconstruction of Water, Fat and Silicone Images Using a Combined One-Point and Two-Point Dixon Approach. Application to 3D GRE in Breast Implant Imaging."; in: Proc. Intl. Soc. Mag. Reson. Med.; vol. 17; p. 2105; 2009.

(Continued)

*Primary Examiner* — Rishi R Patel
(74) *Attorney, Agent, or Firm* — Banner & Witcoff Ltd.

(57) ABSTRACT

In a magnetic resonance (MR) method and apparatus for determining an MR image or an MR fat image of an examination subject, first and second MR signal datasets are provided to a computer, respectively obtained at first and second echo times. The computer defines a signal model and determines possible solution candidates for values of parameters of the signal model for each pixel of the two MR signal datasets so that the MR signals thereof are matched as well as possible. A correct solution is selected from the solution candidates, using a calculated phase map, based on predetermined assumptions regarding the calculated phase map. The MR water image or the MR fat image is determined using the correct solution.

8 Claims, 3 Drawing Sheets

(56) References Cited

U.S. PATENT DOCUMENTS

2016/0169995 A1   6/2016   Nickel

OTHER PUBLICATIONS

Jingfei, Ma: "Breath-Hold Water and Fat Imaging Using a Dual-Echo Two-Point Dixon Technique With an Efficient and Robust Phase-Correction Algorithm"; in: Magnetic Resonance in Medicine; vol. 52; pp. 415-419 2004.; 2004.
Xiang: "Two point water-fat Imaging with partially-opposed-phase (POP) acquisition: an A-symetric Dixon Method", Magnetic Resonance in Medicine 56:572 bis 584, 2006; 2006.
Holger Eggers et al: "Dual-Echo Dixon Imaging with Flexible Choice of Echo Times", Magnetic Resonance in Medicine 65:96?107 (2011); 2011.

\* cited by examiner

METHOD AND APPARATUS FOR ACQUIRING MAGNETIC RESONANCE DATA DIXON METHOD WITH FLEXIBLE ECHO TIMES

BACKGROUND OF THE INVENTION

Field of the Invention

The present invention concerns a method for determining a magnetic resonance (MR) water image or an MR fat image of an examination object that contains water and fat components. The invention further concerns a device for determining the MR water image or the MR fat image, as well as to a magnetic resonance apparatus and a non-transitory, electronically-readable data storage medium that implement such a method.

Description of the Prior Art

In MR measurements (data acquisition), it is possible to separate different spectral components, such as fat and water components in the examination object. The spectral components in the MR signal originate from nuclear spins respectively in different environments, namely a fat environment or a water environment. Multi-echo MR measurements within the well-known Dixon technique are often used for the separation of fat and water components. The Dixon techniques make use of the fact that the resonant frequency of the relevant nuclear spins depends on the molecular or the chemical environment thereof, known as the chemical shift. Different tissue components such as fat and water thus exhibit different resonant frequencies, which are represented in the MR signals. As well as the separation of fat and water, suppression of fat signals can also be achieved using Dixon techniques.

Often the chemical shift between hydrogen nuclear spins in water is considered as a first spectral component, and hydrogen nuclear spins in fatty acid chains is considered as a second spectral component. In such cases an MR water image or an MR fat image can be calculated on the basis of the MR data, i.e. the individual images of the two spectral components. This is of interest for various clinical and medical applications. In the separation of fat and water with the Dixon method, MR signals are acquired at a number of echo times. The different spectral components have different phase positions at the different echo times. Fat separation with the Dixon method has greater restrictions as far as the obtainable resolution and the measurement duration are concerned, since two different contrasts with specific fat-water dephasings must be acquired.

In order to overcome such restrictions of the Dixon method, versions have been developed that allow almost any given contrasts, which are no longer restricted to same-phase and opposing-phase water-fat dephasings. A requirement in these versions is to determine the phase development maps or phase evolution maps that are ultimately necessary for unique calculations. As well as the chemical environment of the tissue in question, the MR system itself and its components have an influence on the phase position. Any errors in the determination of the phase evolution maps, which show the MR-system-related phase developments, lead to local fat and water transpositions in the calculated fat or water images.

Furthermore, it must be taken into account with the phase evolution maps that the phase of the MR signal can only be shown in a space of $0$-$2\pi$ or of $-\pi$ to $\pi$. This means that at the edges of the phase values, either with $-\pi$ or $\pi$ or with $0$ or $2\pi$, phase jumps of a total of $2\pi$ occur from one pixel to the next, since the phase position is only shown in a restricted range of values, which is $2\pi$. The phase developments in the phase evolution maps are based, inter alia, on field inhomogeneities of the polarization field Bo, on eddy currents, and on gradient delays. With flexible echo times these methods will also be unstable in relation to a fat-water transposition.

SUMMARY OF THE INVENTION

An object of the present invention is to provide an improved method for separation of fat and water components in an examination object, which is flexible in the choice of fat dephasing and yet, despite this, still makes a stable separation of fat and water components possible.

A first aspect of the invention is a method for determining an MR water image or an MR fat image of an examination object, which has water and fat components. In this method, a first signal dataset is determined, which contains MR signals of the examination object at a first echo time, and a second MR signal dataset is provided or determined, which contains MR signals of the examination object at a second, different echo time. In the respective two MR signal datasets, the fat signal has a different dephasing relative to the water signal at the respective echo times. Furthermore, a signal model is determined that has a number of signal model parameters, which have a water signal component, a fat signal component, and two model phase values, which correspond to a phase value of the water component at the two echo times. The signal model here relates the recorded MR signals of the first MR signal dataset and of the second MR signal dataset to the water signal component, the fat signal component and the model phase values. Possible solution candidates for the values of at least a few of the signal model parameters are determined for each pixel of the two MR signal datasets, wherein the determination is undertaken such that the signal model is the best possible match with the recorded MR signals of the first and the second MR signal dataset. A number of solutions, the possible solution candidates, are produced here, and the correct solution is selected from the possible solution candidates, with the assumption that phase information in at least one calculated phase map runs spatially smoothly. Here the phase information in each pixel of the two MR signal datasets in the at least one calculated phase map is determined in such a way that it corresponds either to two-dimensional tuples of the model phase values or one-dimensional values of a linear combination of the model phase values, wherein the linear combination does not correspond to the phase difference of the model phase values. Subsequently the MR water image or the MR fat image is determined with reference to the selected correct solution of the at least one calculated phase map and of the determined signal model parameter of the water component or of the fat component.

The inventive method, with a flexible choice of the echo times, offers a stable method for separation of fat and water signal components. In this way the phase information can be chosen so that the values of the possible solution candidates lie as far from each other as possible and thus a separation, with the assumption of a weak spatial variation of the phase information, becomes more stable in relation to interruption effects such as noise or changes in susceptibility.

In accordance with a first option, the phase information in the at least one calculated phase map can be any given linear combination of the model phase value of the water component in the first MR signal dataset and the model phase value of the water component in the second MR signal dataset, with the exception of the phase difference. Here the correct solution can be chosen, with the assumption that the given linear combination in the calculated phase map runs spatially smoothly.

Furthermore it is possible for one of the two echo times in the MR signal datasets to be chosen so that, for this one echo time the fat signal and the water signal essentially have an opposed phase position, wherein the phase position of the water signal for this one echo time is used here as the phase information used. The other echo time is preferably able to be chosen at random here.

In the further option, the items of phase information in the at least one calculated phase map correspond to a two-dimensional tuple of the model phase values. Here the phase information is determined in two calculated phase maps for all points, with the assumption that neighboring items of phase information, meaning the neighboring tuples, vary as weakly as possible in a two-dimensional measure.

The phase information cannot be determined directly from the values of the at least one determined phase map, but from the imaginary exponents of the at least one phase map, i.e. from the so-called phasors.

Furthermore, it is possible for the correct solution per pixel not to be calculated directly, but by determining an optimization function in the phase information, wherein this optimization function has one term, for which the solutions per pixel assume a local minimum, and an additional term, which gives preference to the smoothness in the phase information.

Furthermore, the invention encompasses a computer for determining the MR water image or the MR fat image, wherein the computer has a processor and a memory, which stores control information able to be executed by the processor. When executing the control information in the processor, the computer implement the steps described above.

The invention also comprises a magnetic resonance apparatus that includes the computer for calculating the water or fat image and for creating the first and second MR signal dataset.

The present invention also encompasses a non-transitory, computer-readable data storage medium encoded with programming instructions that, when the storage medium is loaded into a computer, cause the computer to execute the programming instructions so as to implement any or all embodiments of the method according to the invention, as described above.

DESCRIPTION OF THE PREFERRED EMBODIMENTS

The present invention will be explained in greater detail below with reference to preferred forms of embodiment, which refer to the enclosed drawings. In the figures the same reference numbers indicate the same or similar elements. Furthermore the figures are schematic diagrams of various forms of embodiment of the invention and the elements shown in the figures are not necessarily shown true-to-scale. Instead, the elements shown in the figures are reproduced in such a way that their function and their purpose is understandable for the person skilled in the art. The connections between functional units or other elements shown in the figures can also be implemented as an indirect connection, wherein a connection can be wireless or wired. Functional units can be implemented as hardware, software, or as a combination of hardware and software.

Figure 1:
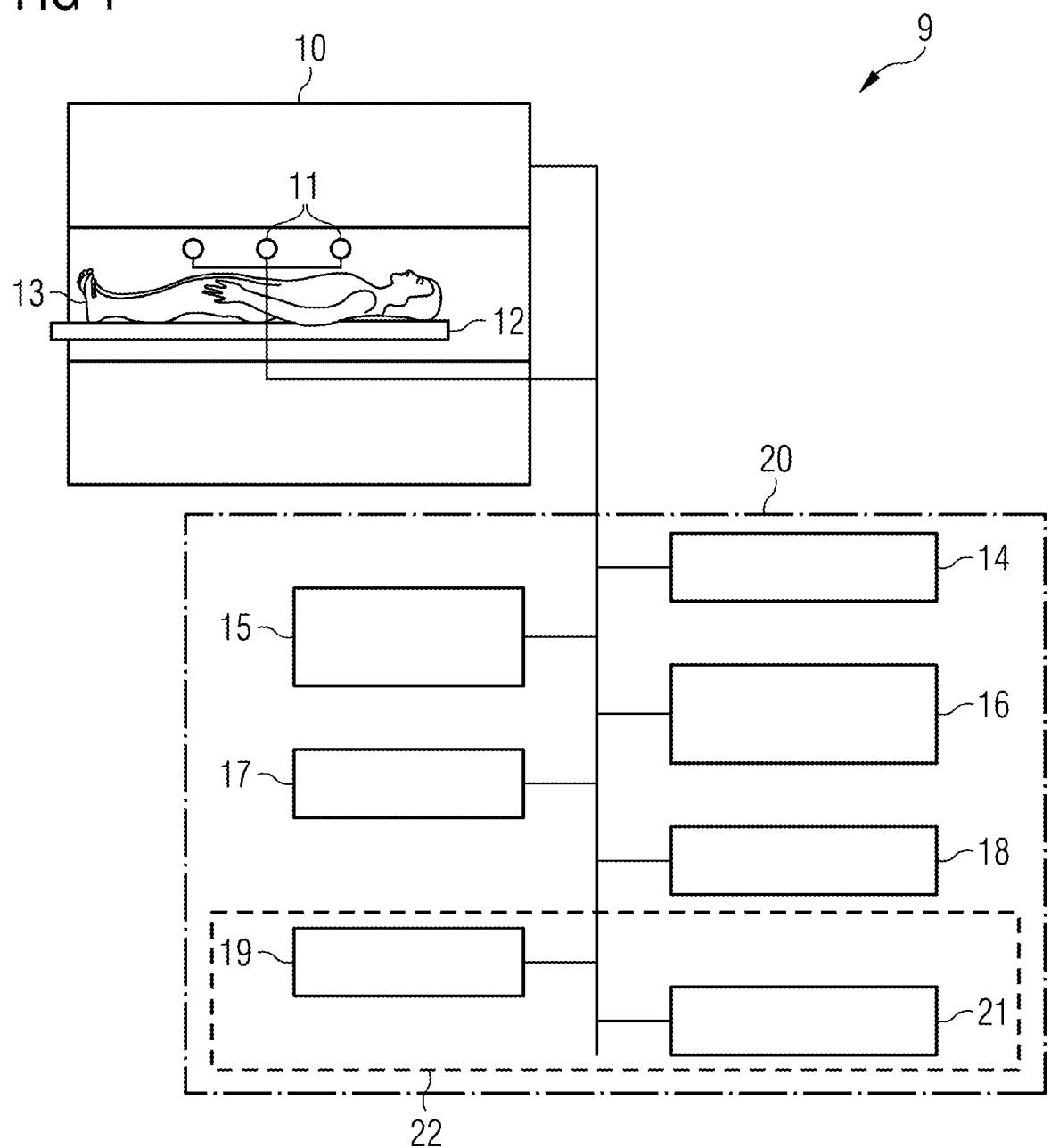
FIG. 1 schematically illustrates an MR apparatus in accordance with the invention, with which the MR signal datasets can be recorded, and that subsequently calculates an MR water image or an MR fat image from the MR signal datasets.

In FIG. 1 an MR apparatus 9 is illustrated schematically, with which, as will be explained below, MR images of an examination object that has different tissue components such as fat and water components can be recorded, wherein the apparatus is designed to subsequently separate the components in an effective manner, so that an MR water image or an MR fat image can be calculated.

The MR apparatus 9 has an MR data acquisition scanner 10 with a basic field magnet that produces a polarization field Bo, wherein a person to be examined 13 on a table is moved into the scanner 10, in order to acquire magnetic resonance signals from the person to be examined 13. The coils 11 used for signal recording represent a whole body coil or local coils. By radiating in radio-frequency pulses and switching magnetic field gradients, the magnetization created by the polarization field Bo can be deflected from the equilibrium and spatially encoded, and the magnetization produced is detected by the receive coils 11. How MR images are created by radiating in the RF pulses and by switching magnetic field gradients in different combinations and orders is basically known to those skilled in the art, and thus need not be explained in greater detail herein.

The MR apparatus 9 furthermore has a control computer 20, which controls the MR apparatus 9. The control computer 20 has an RF controller 14, and a gradient controller 15 for controlling and switching the magnetic field gradients. The RF controller 14 controls the generation of the RF pulses for deflecting the magnetization. A sequence controller 16 controls the order of the magnetic field gradients, the signal detection, and the RF pulses. The operator can control the MR system via an input unit 17, and MR images or other information necessary for control can be displayed on a display unit 18. A processor 19 is provided for control of the various units in the control computer 20. Furthermore, a memory 21 is provided, in which program modules or programs can be stored that, when they are executed by the processor 19, implement the execution sequence of the MR system. The processor 19 here is configured, as will be explained below, so that from the recorded MR signal datasets, the different tissue components such as fat and water can be separated so as to present MR images of the individual tissue components. The processor 19 and the memory 21 can, in combination, form one computer 22, which calculates water images or fat images on the basis of control information stored in the memory 21, which is executed in the processor 19. The invention is not restricted to fat and water, it can also be used for other tissue components such as water and silicon or fat and silicon. In general it is applicable to an examination object that has two different tissue components, which have a different dephasing to one another at the echo times.

The MR system now records two MR signal datasets, at a first echo time $T_e1$ and at a second echo time $T_e2$. The two echo times are different, so that a different dephasing of the fat signal relative to the water signal is present at the echo times.

As well as the phase evolution between the recorded MR signal datasets, there is at the phase at the time of the excitation. The at least one phase map at any given point in time of the signal can be calculated from the two phases at the excitation and the water and fat component. This calculated phase map with phase information shown can also be used for removal of the phase jump, the so-called phase unwrapping.

In an embodiment two phase maps are calculated, in which a phase unwrapping is carried out, wherein simultaneous smoothness in both phase maps is required. As an alternative to this a suitable superposition can also correspond to the model phase values, wherein smoothness is required for this.

The present method will now be explained in greater detail mathematically.

For the separation of the two tissue components with the aid of the Dixon method more than one solution for each phase is normally produced and phase unwrapping is carried out to select the correct solution from the possible candidates. The signal model at the first echo with echo time $T_e$ in a voxel x can be as follows:

$$S_e(x)=(W(x)+c_eF(x))\exp(i\Omega(x)T_e \pm i\Phi(x)-R^*_2(x)T_e), \quad (1)$$

W is the water component or the water signal here, F is the fat signal, wherein $C_e$ is the fat dephasing at the respective echo time. $\Omega(x)$ is the frequency shift of the water and $\phi(x)$ is the phase modulation between the two signal readouts with opposing polarity, wherein $R^*_2(x)$ represents the relaxation.

Usually $\Omega$ and $\phi$ are determined by the phase unwrapping. For more than two echoes it can be assumed that W and F are complex numbers. In some cases it is possible to assume, especially with the two-point Dixon method, that W and F are real values. In this case it is necessary to introduce a common phase of the fat and water.

In the present case the following signal model is now used:

$$S_e(x)=(W(x)+c_eF(x))\exp(i\phi_e(x)), \quad (2)$$

wherein W and F are real values. This means that a signal model is used that uses one water signal component, one fat signal component and two model phases, which correspond to the phase values of the water at the two echo times. With the usual two-point Dixon method it is then assumed that $\phi_2(x)-\phi_1(x)$, i.e. the difference of the two phase values of the water at the two echo times is smooth and the result can be determined by phase unwrapping. The method is stable when the echo times correspond to specific phase conditions, i.e. when both phases of the different tissue are in phase or have an opposing phase position (the so-called in-phase and opposed-phase condition). In this case the possible values of $\phi_2(x)-\phi_1(x)$ are separated by $\pi$ from one another. It is however desirable to deviate from the condition of the opposing phase position. In this case the possible solutions are no longer equally spaced, larger and smaller spacings arise. The distance of the phase jump is thus more susceptible to errors. In the conventional Dixon technique the phase difference between first and second echo is used. This means that conventional Dixon also imposes requirements on the second echo time. In one form of embodiment of the invention only the phase of the opposed echo time is used. This makes it possible to choose any given second echo time. This phase alone then actually varies more strongly than the phase difference, since it contains the phase of the excitation pulse and of the receive coils. The latter are not unique, but are smoother than before in more modern MR systems, so that ultimately the advantages of the form of embodiment described above prevail.

Furthermore, a one-point Dixon method is known, which is recorded at the echo time of the opposing phase position, wherein it is assumed that $\phi_1(x)$ is smooth and the phase jump has already been removed. This is a justified assumption, in particular with newer MR systems with greater phase stability.

The basis of the invention is to make a better choice for the removal of the phase jump as the phase difference of the model phase values $\phi_2(x)-\phi_1(x)$. If, for example, at one of the echoes the two tissue components have an opposing phase position, the phase is better suited for the removal of the phase jump, if the other echo or echoes are recorded so that they have an orthogonal phase position in relation to one another.

The following case is considered for this:

$$S(x)=\Phi(x)Av(x), \quad (3)$$

wherein $$S(x) = \begin{pmatrix} S_0(x) \\ S_1(x) \end{pmatrix}, \Phi(x) = \begin{pmatrix} e^{i\phi_1(x)} & \\ & e^{i\phi_2(x)} \end{pmatrix}, \quad (4)$$

$$A = \begin{pmatrix} 1 & c_0 \\ 1 & c_1 \end{pmatrix}, v(x) = \begin{pmatrix} W(x) \\ F(x) \end{pmatrix}.$$

with a minimization with the smallest square with $A_R$ the real part of A and $A_I$ the imaginary part of A, it then follows that:

$$v(x) = (A_R^\dagger A_R + A_I^\dagger A_I)^{-1} \Re(A^\dagger \Phi(x)^\dagger D(x)) \quad (5)$$

$$= (A_R^\dagger A_R + A_I^\dagger A_I)^{-1} (A_R^\dagger \; A_I^\dagger) \begin{pmatrix} \Re(\Phi(x)^\dagger D(x)) \\ \Im(\Phi(x)^\dagger D(x)) \end{pmatrix}$$

and the following is obtained $$\chi^2(\{\phi_1(x)\},\{\phi_2(x)\}) = \sum_{u \in U} \Bigg( D(x)^\dagger D(x) - (\Re(\Phi(x)^\dagger D(x)) \; \Im(\Phi(x)^\dagger D(x))) \quad (6)$$

$$\underbrace{\begin{pmatrix} A_R \\ A_I \end{pmatrix} (A_R^\dagger A_R + A_I^\dagger A_I)^{-1} (A_R^\dagger \; A_I^\dagger)}_{=B_R} \begin{pmatrix} \Re(\Phi(x)^\dagger D(x)) \\ \Im(\Phi(x)^\dagger D(x)) \end{pmatrix} \Bigg).$$

The matrix $B_R$ is real, symmetrical and of rank 2 with Eigen values of 1. This means that a projection onto the space is present, which is formed by the columns of $(A_R, A_I)^T$. Thus one can write $BR=j=1,2wjwjT$ wherein the vectors $wj=(wR, jwI,j)T$ are real and orthogonal. With definition of uj=wR,j+iwI,j one obtains with the minimization of the smallest squares in a region U, in which the phases are seen as constant.

$$\chi^2(\phi_1, \phi_2) = \sum_{x \in U} \left( D(x)^\dagger D(x) - \sum_{j=1,2} |\Re(u_j^\dagger \Phi^\dagger D(x))|^2 \right) \tag{7}$$

$$= \sum_{x \in U} \left( D(x)^\dagger D(x) - \frac{1}{2} \sum_{j=1,2} |u_j^\dagger \Phi^\dagger D(x)|^2 - \frac{1}{2} \sum_{j=1,2} \Re((u_j^\dagger \Phi^\dagger D(x))^2) \right).$$

For the determination of the minima of the remaining optimization problem $$\arg \min_{\phi_1, \phi_2} \chi^2(\phi_1, \phi_2), \tag{8}$$

it can be established that a variable can be optimized analytically and an optimization into $\phi = \phi_2 - \phi_1$ remains. From this it follows that $$\phi_2 - \phi_1 = \arg \min_\varphi \left( \sum_{x \in U} \left( D(x)^\dagger D(x) - \frac{1}{2} \sum_{j=1,2} \left| u_j^\dagger \begin{pmatrix} 1 & \\ & e^{-i\varphi} \end{pmatrix} D(x) \right|^2 \right) - \frac{1}{2} \left| \sum_{x \in U} \sum_{j=1,2} \left( u_j^\dagger \begin{pmatrix} 1 & \\ & e^{-i\varphi} \end{pmatrix} D(x) \right)^2 \right| \right) \tag{9}$$

and with the definition of $$p(\varphi) = \sum_{x \in U} \sum_{j=1,2} \left( u_j^\dagger \begin{pmatrix} 1 & \\ & e^{-i\varphi} \end{pmatrix} D(x) \right)^2 \tag{10}$$

it then follows that $$\frac{p(\varphi)}{|p(\varphi)|} = e^{2i\phi_1}, \tag{11}$$

This has two solutions for $\phi_1$ in the range of values of $0$-$2\pi$. With the additional assumption that on average W+F is greater than 0 a single solution is produced in the range of $0$-$2\pi$ so that one can write.

$$\phi_1(\varphi) = \frac{1}{2} \arg(p(\varphi))|_{W+F>0} + 2\pi n,$$

$$\phi_2(\varphi) = \varphi + \frac{1}{2} \arg(p(\varphi))|_{W+F>0} + 2\pi n. \tag{12}$$

Since $\varphi$ contains at most two minima in the interval of $0$-$2\pi$, two tuples $\varphi(\frac{1}{2})$, $\phi(\frac{1}{2}), \phi_2(\frac{1}{2})$ are produced, which for each entry can be shifted by multiples of $2\pi$.

The case is considered below that fat is a single maxima with a spectral shift of $-3.4$ ppm relative to water. In the above equation 2 this means $$c_e = \exp(i\Delta\omega_{fat} T_e).$$

From the possible solutions, the actual solution is then produced with an ideal system with $\varphi = \phi_1 = \phi_2 = 0$, which means, $$D = \begin{pmatrix} 1 & c_0 \\ 1 & c_1 \end{pmatrix} \begin{pmatrix} W \\ F \end{pmatrix} \tag{13}$$

A voxel with pure water component can also be identified as a voxel with pure fat component if $\phi_1 = \Delta\omega_{fat} T_1$ and $\phi_2 = \Delta\omega_{fat} T_2$ applies. Thus the following applies for the correct solution $$\varphi_1 = 2\pi n_1,$$

$$\varphi_2 = 2\pi n_2,$$

$$\varphi = 2\pi n. \tag{14}$$

and the following for the incorrect solution $$\varphi_1 = -\Delta\omega_{fat} T_1 + 2\pi n_1,$$

$$\varphi_2 = -\Delta\omega_{fat} T_2 + 2\pi n_2,$$

$$\varphi = -\Delta\omega_{fat}(T_2 - T_1) + 2\pi n. \tag{15}$$

The simplest differentiation between these two solutions is possible when they differ from one another by the factor $\pi$. For the known conditions of the parallel and opposing phase position this is true for $\phi_1$ and $\varphi$, wherein $\phi_2$ is degenerated and is thus useless. By contrast with this, in the event of orthogonal phases at one echo time and opposing phases at another echo time, the best choice of the three options presented is $\phi_2$, since only for $\phi_2$ do the possible solution candidates differ by the maximum possible distance from $\pi$.

The basis for this is to remove a phase jump, which not only requires a smoothness in y i.e. of the phase difference, but also a smoothness in $\phi_1$ and $\phi_2$ or a smoothness in a given linear combination of the phases $\phi 1$ and $\phi_2$ $$\psi_{phase-to-unwrap} = m\phi_1 + n\phi_2, m, n \in \mathbb{Z}. \tag{16}$$

For a few other techniques the two phases $\phi_1$ and $\phi_2$ can be considered as independent and smoothness demanded in both phases for determining the desired solution at each pixel. Thus a two-dimensional metric in $(\phi_1, \phi_2)$ can be used as a measure for the spatial variation between neighboring points and this can be used as a measure of quality in a region-growing algorithm, which starting off from a start point, defines solution for pixel step-by-step in such a way that these vary as little as possible relative to proximity already defined.

Figure 2:
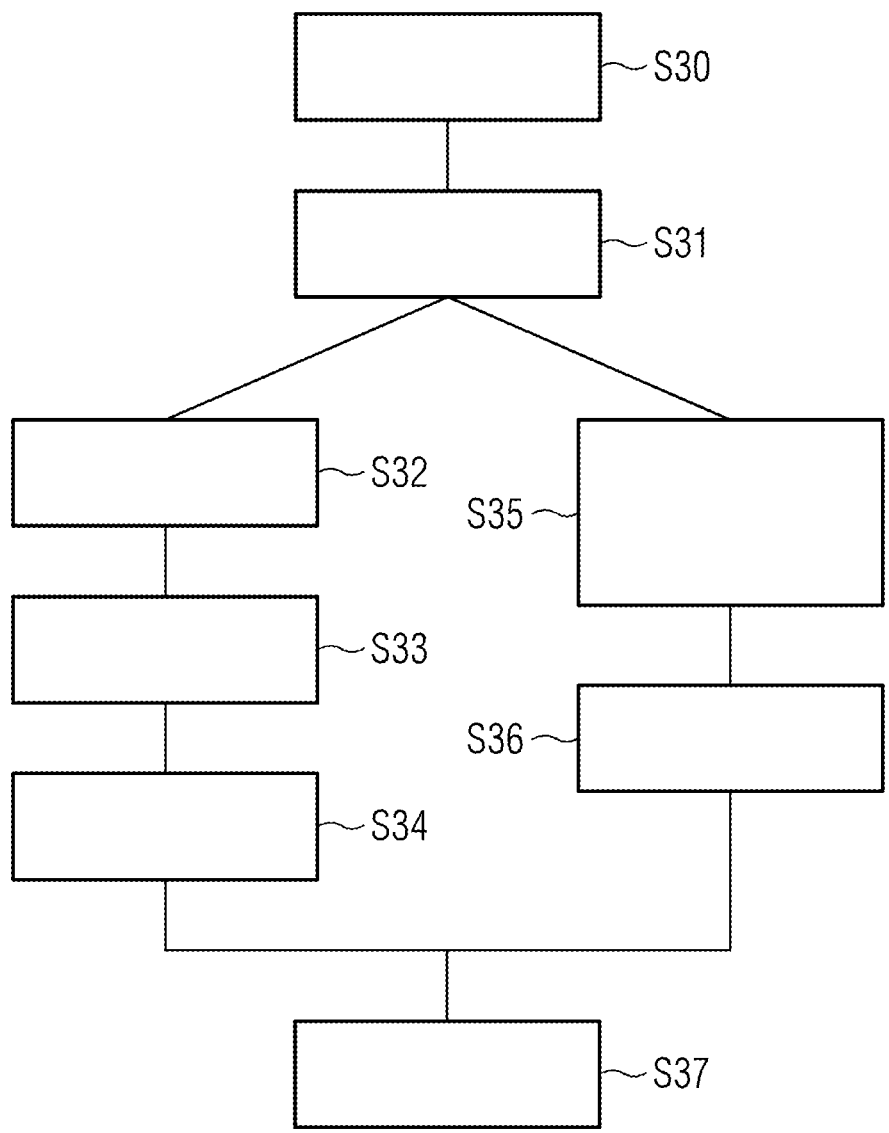
FIG. 2 is a flowchart of the steps for calculating an MR water or fat image in accordance with the invention.

In FIG. 2 the basic steps of the method are summarized. In step S30 the two MR signal datasets are recorded at the different echo times $T_e 1$ and $T_e 2$. Subsequently the signal model is determined, which, in accordance with equation 2, has the 4 signal parameters in each case, the water signal component W, the fat signal component F and two model phase values $\phi_1$ and $\phi_2$, namely the phase values of the water signal at the two echo times. The model parameters are now determined so that the signal components calculated with the model parameters correspond to the two MR signal datasets as well as possible. For this at least one phase map is calculated, which shows phase information. In the left-hand branch of FIG. 2 the phase map is a linear combination of the model phases, in the right-hand branch of FIG. 2 two phase maps are calculated, which correspond to two-dimensional tuples of the model phase values.

First the left branch with the choice of linear combination will be explained. In step S32 there a linear combination takes place as specified in equation 16, for which overall a spatial smoothness is assumed. However this linear combination does not correspond to the phase difference, i.e. in equation 16 m≠−n since this is used in the prior art. In step S33 the possible solution candidates for the values of the signal model parameters for the pixels are then determined. This can be done based on the amount of the signal. The up to two solutions can be determined here as is described for example in Holger Eggers et al, "Dual-echo Dixon imaging with flexible choice of echo times", Magnetic Resonance in Medicine 65:96-107, 2011. Here, starting from the amounts of the measured signals at each pixel and the known dephasing of fat at each echo time, the possible values of the water and fat signals are initially determined. Since this can be reduced to a quadratic equation, two possible solutions are generally found. For each of these solutions the associated values for $\phi_1$ and $\phi_2$ can then be determined directly.

In step S34 the phase map per pixel is calculated such that the linear combination approaches either the first solution or the second solution, wherein, in a special case, it is equal to the first solution or the second solution and the linear combination is at the same time spatially smooth. Various algorithms are known for the calculation of the phase map of the linear combination, such as region growing, as is described in Jingfei Ma: "Breath Hold water and fat imaging using a dual-echo two-point Dixon technique with an efficient and robust phase correlation algorithm", Magnetic Resonance in Medicine 52:415 to 419, 2004. A further possibility for calculation is described in Xiang: "Two point water-fat Imaging with partially-opposed-phase (POP) acquisition: an Asymmetric Dixon Method", Magnetic Resonance in Medicine 56:572 to 584, 2006.

Then, in step S37, the water or the fat image is determined using the calculated phase map, since the two phases $\phi_1$ and $\phi_2$ can be determined analytically through knowledge of a phase (it is sufficient to know both phases modulo $2\pi$) and furthermore, with knowledge of $\phi_1$ and $\phi_2$, the complex-value signals with water and fat are in a linear relationship. Therefore water and fat are obtained in the last step via linear regression.

Not all signal model parameters have to be explicitly determined here for a solution candidate, but it is possible for the solution candidate to be uniquely determined by a subset.

Referring to the right branch of FIG. 2, in step S35 up to two solutions of tuples are determined, wherein each tuple has a model phase at the first echo time and a model phase at the second echo time. Thus different tuples exist per pixel with the two model phases at the echo times. Subsequently, in step S36, two phase maps are calculated with the phase information, wherein the phase information corresponds to the two-dimensional tuples of the model phase values. The phase maps are determined here in such a way that the phase of the water signal at the 1st and 2nd echo approaches either the first tuple or the second tuple or in a special case is equal to one of the two tuples and wherein the condition is used that the phase of the water signal itself in the 1st echo and in the 2nd echo is as smooth as possible. For step S36 a region-growing can once again be used, as has been explained in conjunction with step S34 for example. Subsequently, as in step S37, the water or the fat image is once again determined using the calculated phase maps for determining the correct solution.

The determination of the phases in S34 and S36 is usually not a convex problem. If the allowed phase jumps are as large as possible, these are more stable to solve as a rule. If errors occur, local fat-water transpositions are generally obtained.

A gradient echo sequence or a spin echo sequence can be used as an imaging sequence. In particular one of the two echo times is chosen so that fat and water are approximately phase-opposed and so that the phase of this phase-opposed echo is assumed to be smooth. Referring to the left branch of FIG. 2, this means that in the linear combination, m=1 and n=0 in equation 16.

Instead of the use of the direct model phases in the calculated phase maps a smoothness in the so-called phasors can also be used i.e. a smoothness in $\exp(j\phi_1)$, $\exp(j\phi_2)$.

Figure 3:
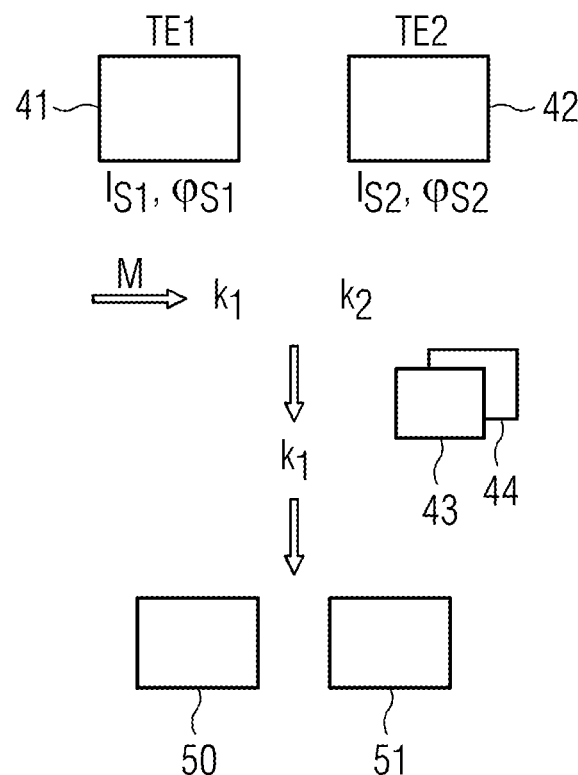
FIG. 3 schematically illustrates how, with the use of the MR signal datasets, the signal model, and on the basis of the calculated phase map, a candidate can be selected from the possible solution candidates, with which an MR fat image or an MR water image can then be determined in accordance with the invention.

FIG. 3 summarizes the described method in another diagram. First of all two MR signal datasets are recorded at different echo times, a first MR signal dataset 41 at echo time $T_e1$. With this signal dataset 41 a pixel-specific intensity $I_{S1}$ and a phase position $\varphi_{S1}$ is produced for each pixel, wherein at this point in time it is not known whether the signal intensity primarily comes from fat components, water components or from both signal components, and wherein the measured signal phase (psi is the resulting signal phase of the two tissue components at each time $T_e1$. In the same way a second MR signal dataset 42 is recorded at echo time $T_e2$, wherein in this signal dataset pixel-specific intensities $I_{S2}$ are again present and another signal phase $\varphi_{S2}$.

A signal model M (see equation 2) is now determined in such a way that the signal model can explain the two measured MR signal datasets at the echo times. This leads to possible solution candidates, which are referred to in FIG. 3 as $k_1$ and $k_2$. As disclosed above in conjunction with equations 12 to 15, there is a correct solution and an incorrect solution. The calculated phase map, simply the linear combination of the model phases or the two model phases themselves form the calculated phase maps 43 and 44. With the aid of these or the phase maps it is possible to find the correct solution from the possible solution candidates, in the case shown the first solution $k_1$. If now the correct solution candidates for the signal model parameters are known, it is possible to calculate an MR water image 50, which only shows the water components of the tissue or a fat image 51, which only shows the fat components of the examined tissue. The water or fat image is the value calculated for each pixel for water and fat. The described method has the objective of making the determination of the phase map more stable or more robust, in order to avoid local transpositions of water and fat, which are produced by choosing the incorrect minimum for the phases at a pixel.

Figure 4:
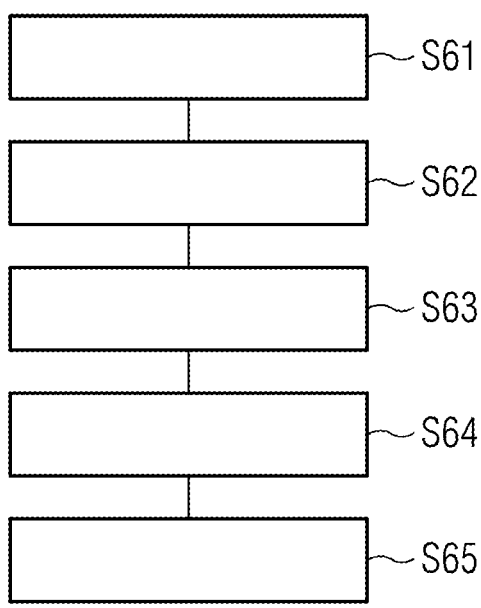
FIG. 4 is a further flowchart for determining an MR water or fat image, which can be implemented by the computer of the MR system shown in FIG. 1.

The basic steps of the method are summarized in FIG. 4. In step S61 the two MR images are recorded, wherein in step S62 the signal model is defined with the signal model parameters as explained above. In step S63 the possible solution candidates for at least a few of the signal model parameters are determined, wherein not all signal model parameters have to be explicitly calculated for a solution candidate. The signal model parameters can also be uniquely defined by a subset of the signal model parameters determined. After selection of the correct solution in step S64 from the solution candidates with the aid of the calculated phase map or the calculated phase maps it is subsequently possible to determine the fat or water image in step S65.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A computerized method for determining a magnetic resonance (MR) water image or an MR fat image of an examination subject containing a water component and a fat component, comprising:

providing a computer with a first MR signal dataset that comprises pixels represented by MR signals obtained from the examination subject at a first echo time following excitation of nuclear spins in the examination subject, and a second MR signal dataset that comprises pixels represented by MR signals obtained from the examination subject at a second echo time following said excitation of nuclear spins, said first and second MR signal datasets respectively having different dephasing of a fat signal relative to a water signal at the respective first and second echo times;

in said computer, defining a signal model comprising a plurality of signal model parameters, which include a water signal component, a fat signal component, and two model phase values respectively corresponding to a phase value of the water component at said first and second echo times, said signal model relating the MR signals of said first MR signal dataset and the MR signals of the second MR single dataset to said water signal component, to said fat signal component, and to said model phase values;

in said computer, determining solution candidates for respective values of at least some of said signal model parameters for each pixel of said first and second MR signal datasets, so that said signal model matches the obtained MR signals of the first and second MR signal datasets;

in said computer, selecting a correct solution from said solution candidates using a condition that in at least one calculated phase map, phase information proceeds spatially smoothly by determining phase information for each pixel of said first and second signal datasets in said at least one calculated phase map so as to correspond either to (i) two-dimensional tuples of the model phase values, with said phase information being determined in two respective phase maps calculated for each pixel of said first and second MR signal datasets, with a further condition that neighboring phase information in said at least one calculated phase map, which is selected from among the two respective phase maps, minimally varies in two dimensions, or (ii) one-dimensional values of a linear combination of the model phase values of the water component in the first MR signal dataset, and the model phase values of the water component in the second MR signal dataset, wherein the linear combination does not result in a phase difference between the model phase values; and in said computer, determining said water image or said fat image from said correct solution of said at least one calculated phase map and the determined signal model parameter of the water component or the fat component, respectively.

2. A method as claimed in claim 1, comprising selecting said solution based on a further condition that said linear combination proceeds spatially smoothly in said at least one calculated phase map.

3. A method as claimed in claim 1, comprising containing said first and second MR signal datasets with said first and second echo times being selected so that, in one of said first and second echo times, said fat signal and said water signal have opposed phase positions, and the phase position of the water signal in said one of said first and second echo times being used as said phase information, and selecting the other echo time of said first and second echo times at random.

4. A method as claimed in claim 1, comprising determining said phase information from mathematically imaginary exponents of said at least one calculated phase map, and not directly from values in said at least one calculated phase map.

5. A method as claimed in claim 1, comprising determining said solution per pixel by determining an optimization function in said phase information, said optimization function comprising one term for which the solution candidates per pixel assume a local minimum, and an initial term that gives preference to smoothness in the phase information.

6. A computer for determining a magnetic resonance (MR) water image or an MR fat image of an examination object, which comprises a water component and a fat component, said computer comprising:

a processor provided with a first MR signal dataset that comprises pixels represented by MR signals obtained from the examination object at a first echo time following excitation of nuclear spins in the examination object, and a second MR signal dataset that comprises pixels represented by MR signals obtained from the examination subject at a second echo time following said excitation of nuclear spins, said first and second MR signal datasets respectively having different dephasing of a fat signal relative to a water signal at the respective first and second echo times;

said processor being configured to define a signal model comprising a plurality of signal model parameters, which include a water signal component, a fat signal component, and two model phase values respectively corresponding to a phase value of the water component at said first and second echo times, said signal model relating the MR signals of said first MR signal dataset and the MR signals of the second MR single dataset to said water signal component, to said fat signal component, and to said model phase values;

said processor being configured to determine solution candidates for respective values of at least some of said signal model parameters for each pixel of said first and second MR signal datasets, so that said signal model matches the obtained MR signals of the first and second MR signal datasets;

said processor being configured to select a correct solution from said solution candidates, using a condition that in at least one calculated phase map, phase information proceeds spatially smoothly by determining phase information for each pixel of said first and second signal datasets in said at least one calculated phase map so as to correspond either to (i) two-dimensional tuples of the model phase values, with said phase information being determined in two respective phase maps calculated for each pixel of said first and second MR signal datasets, with a further condition that neighboring phase information in said at least one calculated phase map, which is selected from among the two respective phase maps, minimally varies in two dimensions, or (ii) one-dimensional values of a linear combination of the model phase values of the water component in the first MR signal dataset, and the model phase values of the water component in the second MR signal dataset, wherein the linear combination does not result in a phase difference between the model phase values; and said processor being configured to determine said water image or said fat image from said correct solution of said at least one calculated phase map and the determined signal model parameter of the water component or the fat component, respectively.

7. A magnetic resonance (MR) apparatus for determining an MR water image or an MR fat image of an examination subject, which comprises a water component and a fat component, said MR apparatus comprising:

an MR data acquisition scanner;

a computer configured to operate said MR data acquisition scanner in order to obtain a first MR signal dataset that comprises pixels represented by MR signals from the examination subject during a first echo time following excitation of nuclear spins in the examination subject, and a second MR signal dataset that comprises pixels represented by MR signals obtained from the examination subject during a second echo time following said excitation of nuclear spins, said first and second MR signal datasets respectively having different dephasing of a fat signal relative to a water signal at the respective first and second echo times;

a processor provided with said first and second MR signal datasets, said processor being configured to define a signal model comprising a plurality of signal model parameters, which include a water signal component, a fat signal component, and two model phase values respectively corresponding to a phase value of the water component at said first and second echo times, said signal model relating the MR signals of said first MR signal dataset and the MR signals of the second MR single dataset to said water signal component, to said fat signal component, and to said model phase values;

said processor being configured to determine solution candidates for respective values of at least some of said signal model parameters for each pixel of said first and second MR signal datasets, so that said signal model matches the obtained MR signals of the first and second MR signal datasets;

said processor being configured to select a correct solution from said solution candidates, using a condition that in at least one calculated phase map, phase information proceeds spatially smoothly by determining phase information for each pixel of said first and second signal datasets in said at least one calculated phase map so as to correspond either to (i) two-dimensional tuples of the model phase values, with said phase information being determined in two respective phase maps calculated for each pixel of said first and second MR signal datasets, with a further condition that neighboring phase information in said at least one calculated phase map, which is selected from among the two respective phase maps, minimally varies in two dimensions, or (ii) one-dimensional values of a linear combination of the model phase values of the water component in the first MR signal dataset, and the model phase values of the water component in the second MR signal dataset, wherein the linear combination does not result in a phase difference between the model phase values; and said processor being configured to determine said water image or said fat image from said correct solution of said at least one calculated phase map and the determined signal model parameter of the water component or the fat component, respectively.

8. A non-transitory, computer-readable data storage medium encoded with programming instructions, said storage medium being loaded into a computer and said programming instructions causing said computer to:

receive a first MR signal dataset that comprises pixels represented by MR signals obtained from the examination object at a first echo time following excitation of nuclear spins in the examination object, and a second MR signal dataset that comprises pixels represented by MR signals obtained from the examination subject at a second echo time following said excitation of nuclear spins, said first and second MR signal datasets respectively having different dephasing of a fat signal relative to a water signal at the respective first and second echo times;

define a signal model comprising a plurality of signal model parameters, which include a water signal component, a fat signal component, and two model phase values respectively corresponding to a phase value of the water component at said first and second echo times, said signal model relating the MR signals of said first MR signal dataset and the MR signals of the second MR single dataset to said water signal component, to said fat signal component, and to said model phase values;

determine solution candidates for respective values of at least some of said signal model parameters for each pixel of said first and second MR signal datasets so that said signal model matches the obtained MR signals of the first and second MR signal datasets;

select a correct solution from said solution candidates using a condition that in at least one calculated phase map, phase information proceeds spatially smoothly by determining phase information for each pixel of said first and second signal datasets in said at least one calculated phase map so as to correspond either to (i) two-dimensional tuples of the model phase values, with said phase information being determined in two respective phase maps calculated for each pixel of said first and second MR signal datasets, with a further condition that neighboring phase information in said at least one calculated phase map, which is selected from among the two respective phase maps, minimally varies in two dimensions, or (ii) one-dimensional values of a linear combination of the model phase values of the water component in the first MR signal dataset, and the model phase value of the water component in the second MR signal dataset, wherein the linear combination does not result in a phase difference between the model phase values; and determine said water image or said fat image from said correct solution of said at least one calculated phase map and the determined signal model parameter of the water component or the fat component, respectively.

* * * * *